United States Patent [19]
Burke et al.

[11] Patent Number: 6,017,002
[45] Date of Patent: *Jan. 25, 2000

[54] THIN-FILM SOLAR REFLECTORS DEPLOYABLE FROM AN EDGE-STOWED CONFIGURATION

[75] Inventors: Stephen D. Burke; Ray A. Stribling, Jr., both of Redondo Beach, Calif.

[73] Assignee: Hughes Electronics Corporation, El Segundo, Calif.

[*] Notice: This patent is subject to a terminal disclaimer.

[21] Appl. No.: 08/897,848

[22] Filed: Jul. 21, 1997

[51] Int. Cl.$^7$ .................................................. B64G 1/44
[52] U.S. Cl. ........................ 244/173; 136/245; 136/292
[58] Field of Search ................ 244/173, 158 R; 136/245, 246, 292; 126/692; 24/17 A, 265 CD; 160/23.1

[56] References Cited

U.S. PATENT DOCUMENTS

| | | | |
|---|---|---|---|
| 3,232,795 | 2/1966 | Gillette et al. | 136/246 |
| 3,473,758 | 10/1969 | Webb | 244/173 |
| 3,690,080 | 9/1972 | Dillard | 244/173 |
| 3,735,943 | 5/1973 | Fayet | 244/173 |
| 3,778,312 | 12/1973 | Karius | 244/173 |
| 4,014,617 | 3/1977 | Meston | 244/173 |
| 4,236,280 | 12/1980 | Kreiseder | 24/17 A |
| 4,282,394 | 8/1981 | Lackey et al. | 136/245 |
| 4,513,734 | 4/1985 | Butler | 126/439 |
| 4,636,579 | 1/1987 | Hanak et al. | 136/245 |
| 5,131,955 | 7/1992 | Stern et al. | 244/173 |
| 5,520,747 | 5/1996 | Marks | 244/173 |

FOREIGN PATENT DOCUMENTS

| | | | |
|---|---|---|---|
| 54-57886 | 5/1979 | Japan | 136/246 |
| 4-146897 | 5/1992 | Japan . | |

OTHER PUBLICATIONS

Sokolsky, Ilene, et al., "Thin Film Solar Concentrator", Naval Research Laboratory, thin flim pp. 1–8.

*Primary Examiner*—Peter M. Poon
*Assistant Examiner*—Frank Palo
*Attorney, Agent, or Firm*—Georgann S. Grunebach; M. W. Sales

[57] ABSTRACT

Flexible, lightweight reflective sheets are positioned to concentrate solar radiation upon spacecraft solar panels. The sheets are held with inner and outer spring members which urge each sheet from a gathered edge-stowed configuration towards a deployed, planar configuration. The outer spring members further urge each fully extended sheet to rotate about an axis along the panel's edge in a direction away from the solar panel's face. Restraint members in the form of tethers limit this rotation to place the sheet in a stable deployed position and orientation chosen by design to reflect solar radiation onto the panel face. The increased incident radiation permits a reduction of the number of solar cells needed to satisfy a power requirement, and allows consequent savings in spacecraft cost and weight. The outer spring members are resilient, elongate members which flex to a stowed position behind a respective panel or inerleavably gather with the flexible sheet into a compact stowed configuration adjacent a panel edge.

42 Claims, 8 Drawing Sheets

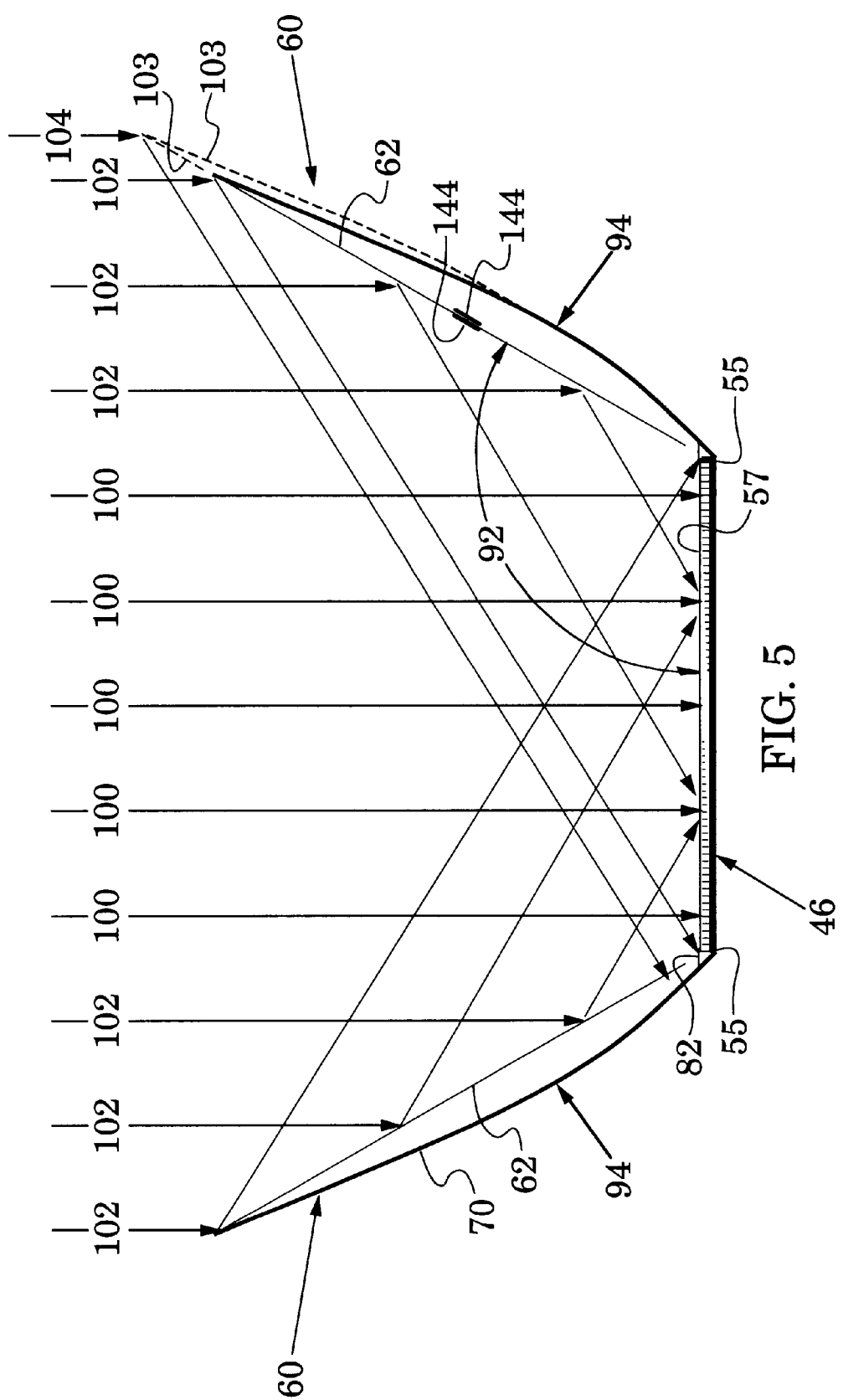

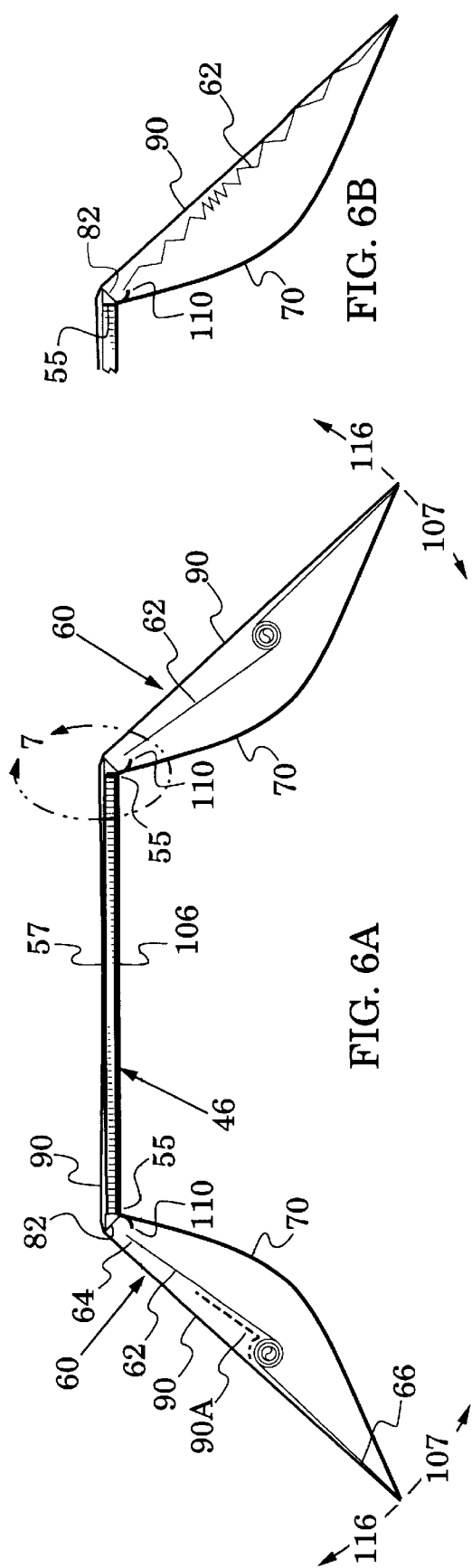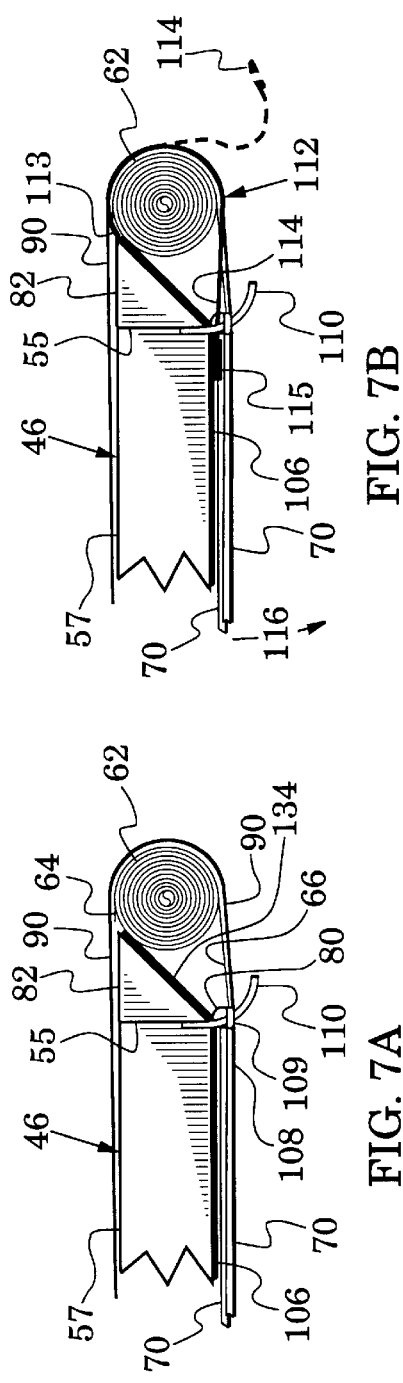

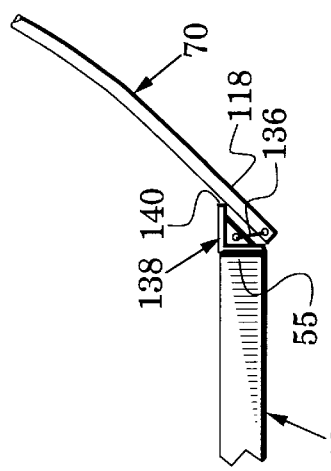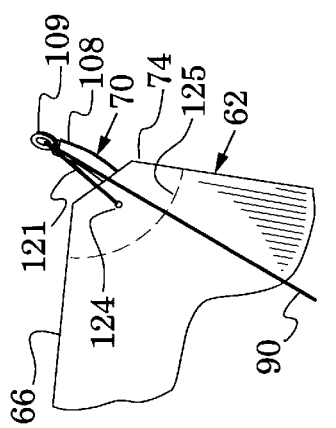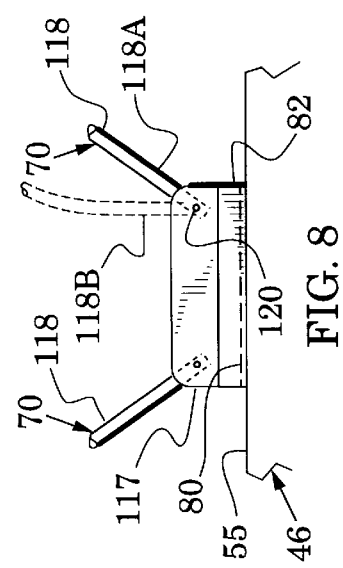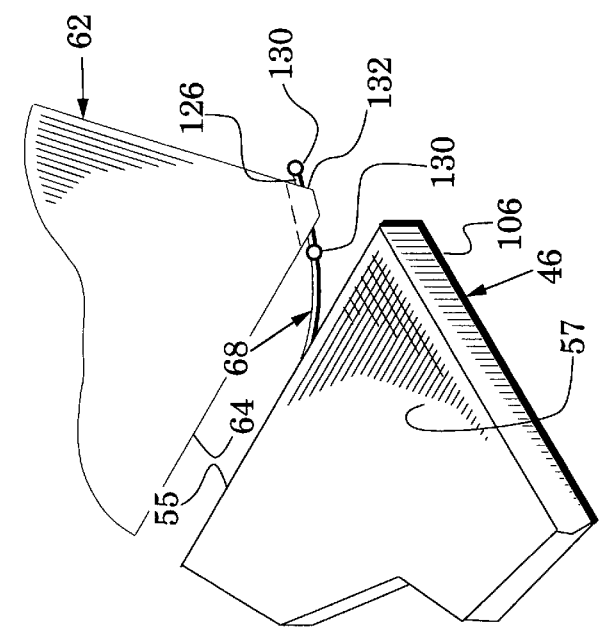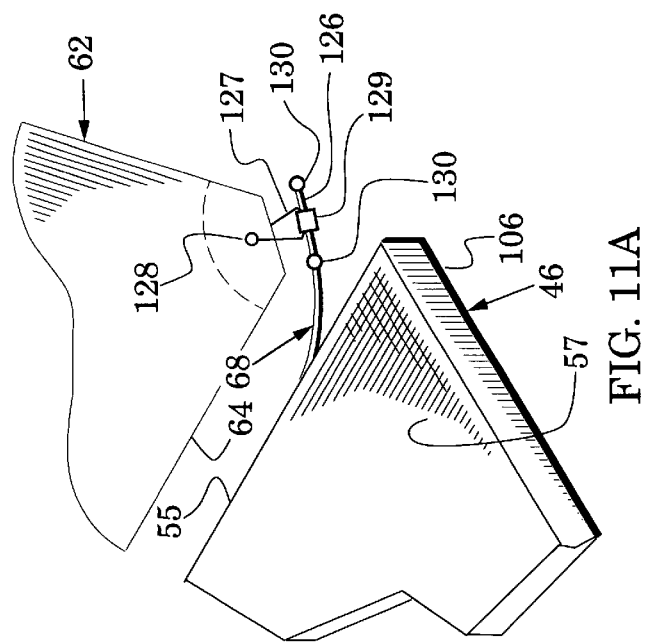

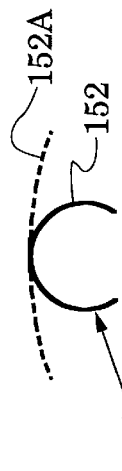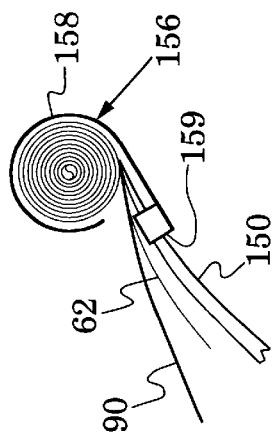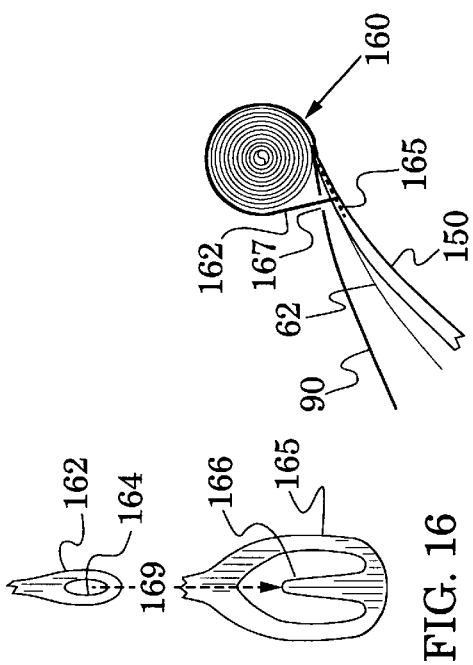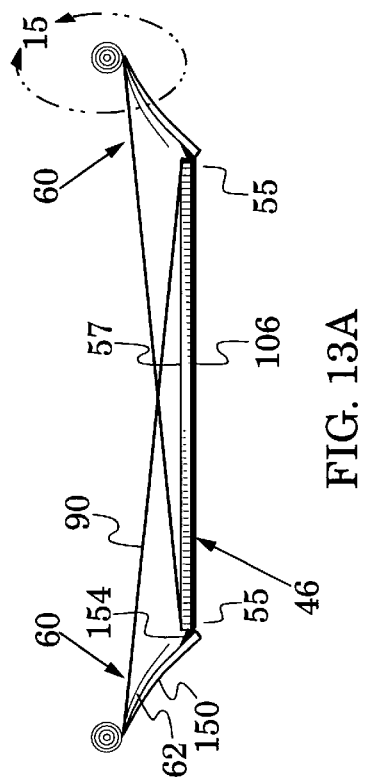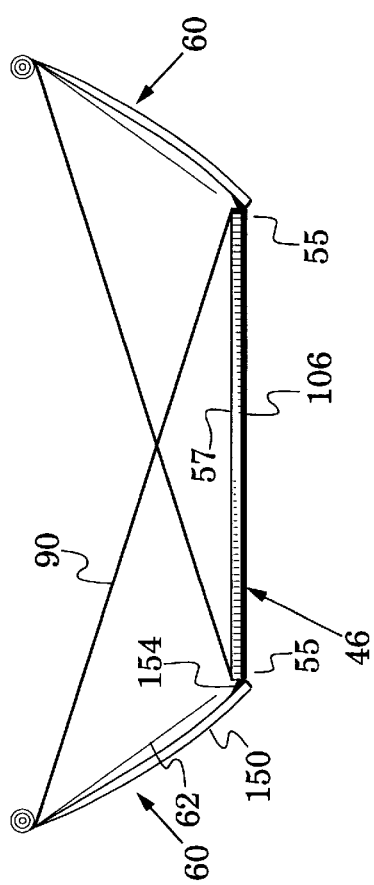

THIN-FILM SOLAR REFLECTORS DEPLOYABLE FROM AN EDGE-STOWED CONFIGURATION

BACKGROUND OF THE INVENTION

1. The present invention relates generally to spacecraft and, more particularly, to spacecraft solar arrays.

2. Description of the Related Art

Spacecraft typically carry solar cells as a primary energy source with rechargable batteries providing energy storage for eclipse operations. The solar cells are positioned and oriented on the spacecraft so that they are exposed to solar radiation.

On spinning spacecraft, solar cells are generally arranged about the outside of a spinning spacecraft body. Accordingly, only a fraction of the cells are exposed to solar radiation at any instant in time. On body-stabilized spacecraft, in contrast, solar cells are typically arranged in planar arrays and carried on solar wings which extend from opposite sides of a spacecraft body. Preferably, the solar wings rotate to keep them as orthogonal to the solar radiation as possible. Because the solar wings can be quite long in their deployed configuration, they are generally formed of a plurality of planar solar panels which are coupled together in an accordion arrangement so that they can be collapsed to a smaller stowed configuration for spacecraft launch.

The number of solar cells that must be carried by a spacecraft is a function of the anticipated spacecraft power demand and the efficiency of the solar cells. Although high-efficiency solar cells reduce the number of cells required by a specific spacecraft, they are quite expensive. Because weight and weight-related costs also increase with the number of solar cells, there is a considerable incentive to reduce the quantity of solar cells that a spacecraft must carry.

Accordingly, efforts have been extended to concentrate solar radiation upon solar cells by using reflective surfaces that are positioned adjacent to solar panels and oriented to reflect additional radiation onto the cells. Solar radiation that would otherwise have passed by a solar wing is thus redirected to be incident upon the solar cells. Although a solar cell's efficiency in conversion of this additional reflected radiation to useful energy is typically less than it is for the directly incident radiation, primarily due to increased cell temperature and decreased angle of incidence, solar concentration allows the number of spacecraft solar cells to be significantly reduced with consequent savings in spacecraft weight and cost.

Both rigid and flexible reflectors have been proposed for solar radiation concentration with flexible reflectors generally having a weight advantage. An exemplary flexible reflector system is shown in U.S. Pat. No. 4,282,394. In this system, reflector arms are carried on both inboard and outboard frames. Each of the reflector arms is formed of a plurality of hinged arm sections and each arm section of the inboard frame carries a reflective plastic sheet that is wound on a spring-biased roll. An end of each sheet is attached to a respective arm section on the outboard frame.

During deployment, an extensible shaft moves the outboard frame away from the inboard frame and each reflective sheet is unrolled to reflect solar radiation onto solar cells. Although this reflector system concentrates solar radiation, its complex structure (e.g., hinged arms, inboard and outboard frames and extensible shaft) significantly contributes to spacecraft weight and cost.

In an exemplary Naval Research Laboratory design, a single thin-film reflector spans a plurality of solar panels that are coupled together in an accordion arrangement. Each thin-film reflector is carried with tension springs between a pair of rotatable booms. Because the edges are configured to assume a catenary shape, the reflector film is held very flat under near-uniform inplane tension. In order to fold the solar panels into a stowed position, the booms rotate to lie alongside the panels and the thin-film reflector is rolled (e.g., from the reflector center) so that it lies parallel to the booms. Although this reflector system is potentially lighter and simpler than the system described above, it still involves numerous mechanical parts (e.g., booms, cables and pulleys) which have significant weight and complexity.

Other reflector systems are described in U.S. patent application Ser. No. 08/081,909, filed Jun. 18, 1993 and now abandoned (as a continuation of application Ser. No. 07/802,972, filed Dec. 6, 1991 and now abandoned), titled "Augmented Solar Array with Dual Purpose Reflectors" and assigned to Hughes Electronics, the assignee of the present invention. In an exemplary system, a reflector is formed from a reflective material (e.g., an aluminized polyimide film) that is carried by a peripheral frame or affixed over a ribbed structure or a thin metal sheet. Each reflector is coupled to a solar panel by a hinge mechanism. Prior to spacecraft launch, the reflector is rotated to lie proximate to the solar cell face of the solar panel. After launch, the hinge mechanism rotates the reflector to a position in which it forms a deployment angle with the solar cell face. In an exemplary hinge mechanism, a hinge spring urges the reflector to rotate away from the solar cell face. The hinge mechanism includes a stop member which halts this rotation when the reflector reaches the deployment angle.

In another reflector system embodiment, reflectors are fabricated by suspending a reflective film between a pair of flexible rods that are rigidly coupled to a solar panel. The rods are typically tethered such that the reflectors lie parallel to the solar cell face prior to spacecraft launch. Deployment is effected by untethering which allows the rods to whip directly to a position in which the reflective film forms a deployed angle with the panel.

Although the latter reflector system effectively redirects radiation, the solar reflectors are stowed over the solar cell face of the solar panels. Accordingly, they block the use of the solar panels during any period (e.g., a transfer orbit) in which the solar panels are in a storage position that prevents reflector deployment.

SUMMARY OF THE INVENTION

The present invention is directed to a simple, lightweight and inexpensive solar reflector which can concentrate solar radiation onto a panel face of a solar panel and be gathered to a stowed configuration adjacent a solar panel edge.

These goals are realized with at least one flexible, reflective sheet having an inner margin and an outer margin, at least one inner spring member that couples the inner margin to the panel and urges the inner margin towards the panel and at least one outer spring member that couples the outer margin to the panel and urges the outer margin away from the panel so that the inner and outer spring members cooperatively urge the reflective sheet towards a planar configuration.

The outer spring member is arranged to urge the reflective sheet along a rotation away from the panel face and at least one restraint member is arranged to limit this rotation so that the reflective sheet is restrained in a deployed position in which it defines an angle with the panel to reflect solar radiation upon the panel face. A stop is carried by the panel to abut an inner portion of the outer spring member to manifest the rotary urging of the outer spring member that results in the sheet rotation.

In a reflector embodiment, the reflective sheet is a metallic-coated thin-film polymer, the inner and outer spring members are resilient, elongate members and the restraint member is a tether. Accordingly, reflectors of the invention are extremely light and inexpensive. Preferably, the spring members and the tether are electrically conductive to form conduction paths that discharge potentially damaging electrostatic charges away from the reflective sheet.

In an outer spring member embodiment, a graphite and fiber composite rod rotates between a deployed position in which its urging is restrained by the restraint member and a stowed position behind its respective solar panel.

The reflective sheet gathers to a gathered configuration and is secured to a solar panel edge. Accordingly, the sheet does not limit uses (e.g., interpanel restraint structures) of the area behind the solar panel. In another outer spring member embodiment, a resilient tape is gathered from a deployed position to a stowed position in which it is interleaved with the reflective sheet.

The novel features of the invention are set forth with particularity in the appended claims. The invention will be best understood from the following description when read in conjunction with the accompanying drawings.

BRIEF DESCRIPTION OF THE DRAWINGS

FIG. 5 is a view similar to FIG. 4 which illustrates concentration of solar radiation upon the solar panel by the solar reflectors;

FIG. 6A is a view similar to FIG. 4 which illustrates an interim position of the solar reflectors between the deployed position of FIG. 4 and a stowed position;

FIG. 6B is a view similar to a portion of FIG. 6A which shows a pleated reflector sheet embodiment in contrast to a rolled reflector sheet embodiment of FIG. 6A;

FIG. 7A is an enlarged view of structure within a curved line 7 of FIG. 6A with an outer spring member and a reflective sheet of FIG. 6A shown in a stowed position;

FIG. 7B is a view similar to FIG. 7A which illustrates a securement member that releasably secures the reflective sheet of FIG. 7A in a stowed position;

FIG. 8 is an enlarged view of inner portions of outer spring members of FIG. 3 which illustrates spring member movement between deployed and stowed positions;

FIG. 10 is an enlarged view of structure within the curved line 10 of FIG. 3 which illustrates a rotatable coupling between a reflective sheet and an outer spring member of FIG. 3;

FIGS. 11A and 11B are enlarged views of an inner spring member of FIG. 3 which illustrates rotatable coupling embodiments between the inner spring member and a reflective sheet of FIG. 3;

FIG. 12 is an enlarged view of an inner portion of an outer spring member of FIG. 3 which illustrates another rotatable coupling embodiment between the outer spring member and a reflective sheet of FIG. 3;

FIG. 13A is a view similar to FIG. 6A which illustrates another outer spring member embodiment in an interim position between a stowed and a deployed position;

FIG. 13B is a view similar to FIG. 13A which illustrates another interim position between a stowed and a deployed position;

FIG. 14 shows an enlarged cross section through the outer spring member of FIGS. 13A and 13B;

FIG. 15A is an enlarged view of structure within a curved line 15 of FIG. 13A which illustrates a sliding constraint member that controls deployment of the reflective sheet and outer spring member of FIGS. 13A and 13B;

FIG. 15B is a view similar to FIG. 15A which illustrates another constraint member that, with similar constraint members, sequentially controls deployment of the reflective sheet and outer spring member of FIGS. 13A and 13B; and FIG. 16 is an enlarged view of a release structure in the constraint member of FIG. 15B.

DETAILED DESCRIPTION OF THE PREFERRED EMBODIMENTS

FIGS. 1–16 illustrate solar reflectors in which flexible, lightweight reflective sheets are positioned with inner and outer spring members which urge each sheet from a gathered (e.g., pleated or rolled) configuration towards a deployed planar configuration and farther urge the fully extended sheet in a rotation about a solar panel edge in a direction away from a solar panel face. Restraint members limit this rotation about to place the sheet in a deployed position in which it defines an angle with the panel to reflect solar radiation onto the panel face. The increased incident radiation facilitates a reduction of the number of solar cells needed to provide a given amount of power and a consequent savings in spacecraft cost and weight.

Figure 1:
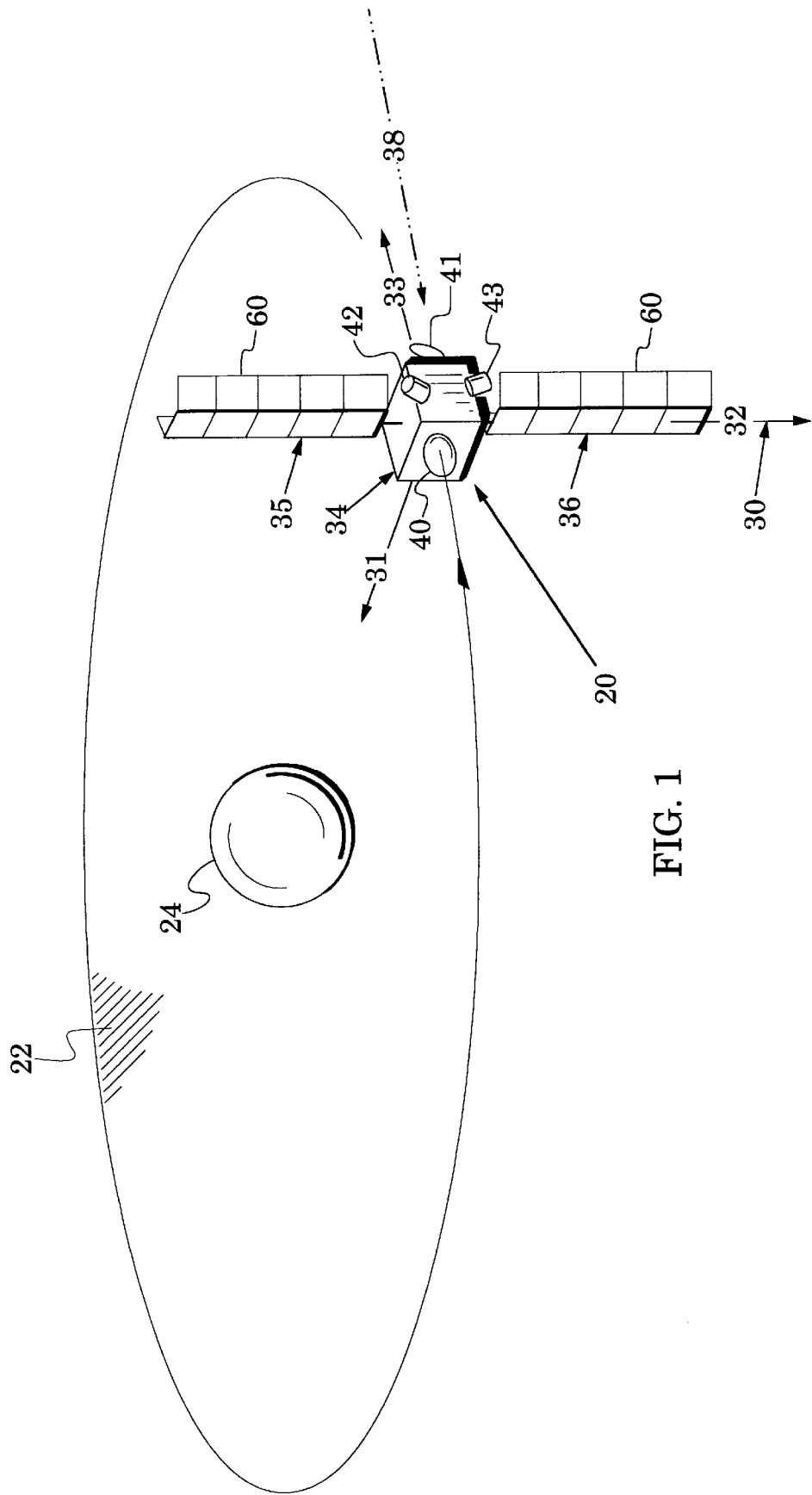
FIG. 1 is a perspective view of a spacecraft in an orbital plane about a celestial body.

In particular, FIG. 1 illustrates a body-stabilized spacecraft 20 which is traveling in an orbital plane 22 about a celestial body such as the Earth 24. The spacecraft's attitude can be described with reference to an orthogonal coordinate system 30 which has an origin at the spacecraft's center of mass. The coordinate system 30 includes a yaw axis 31 which is directed at the Earth 24, a pitch axis 32 which is orthogonal to the orbital plane 22 and a roll axis 33 which is aligned with a velocity vector of the spacecraft 20.

The spacecraft 20 has a body 34 which carries a pair of solar wings 35 and 36 that rotate about the pitch axis 32 so that solar cells of the solar wings are as orthogonal as possible to a Sun line 38 between a Sun (not shown) and the spacecraft 20 (e.g., if the orbital plane 22 is in the Earth's equatorial plane, the solar wings 34 and 36 would be tilted from the Sun line 38 at summer and winter solstice because the Earth travels in an orbital plane which is tilted from the Earth's equatorial plane). Typically, the spacecraft body 34 also carries antennas 40 and 41 for communication with Earth stations and thrusters 42 and 43 for maintenance of spacecraft stationkeeping and attitude control.

Figure 2A:
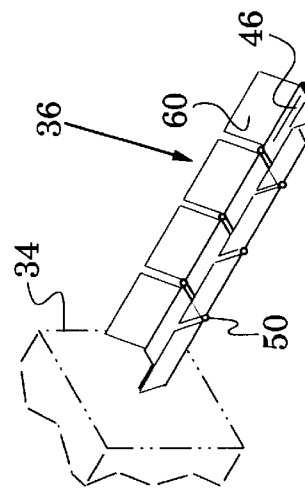
FIGS. 2A–2C are enlarged views of a solar wing on the spacecraft of FIG. 1 which illustrate movement of a typical solar wing between a stowed configuration and a deployed configuration.
Figure 2B:
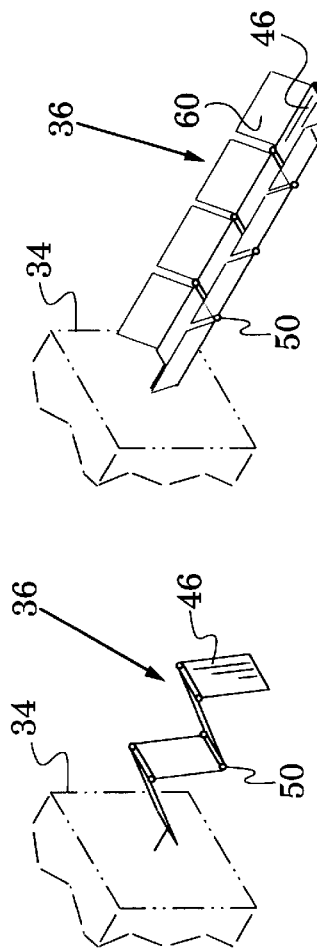
Figure 2C:
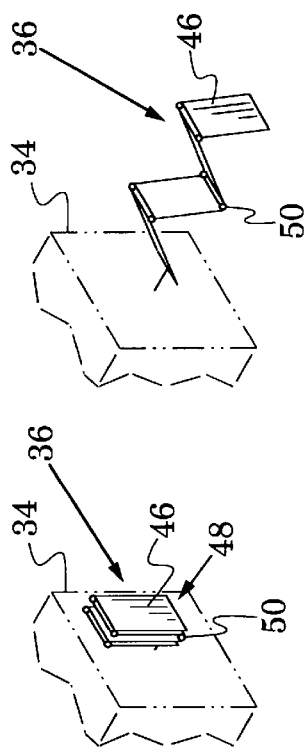

Each of the solar wings 35 and 36 is typically formed of a plurality of hinged solar panels 46 as shown in FIG. 2A (FIG. 1 shows five solar panels per solar wing and FIG. 2 shows four solar panels per solar wing to indicate that the teachings of the invention imply no limitation as to an even or odd number of solar panels). FIG. 2 also shows that the panels 46 have been folded accordion fashion into a stowed configuration 48 adjacent to the spacecraft body 34. In FIG. 2B, the solar panels 46 are shown in a rotation about inter-panel hinges 50 which extend them to the planar, deployed configuration 52 of FIG. 2C.

FIG. 1 shows pairs of solar reflectors 60 of the present invention which are carried by the solar wings 35 and 36 to concentrate solar radiation onto the solar cells of the wings. The solar reflectors 60 are also shown in the deployed configuration 52 of FIG. 2C. Although not specifically shown in FIGS. 2A and 2B, reflective sheets of the solar reflectors 60 gather to stowed positions along the edges of their respective solar panels while outer spring members of the solar reflectors 60 may roll up with their respective sheets or stow behind the solar panel prior to folding of the panels into the stowed configuration 48 of FIG. 2A.

Figure 4:
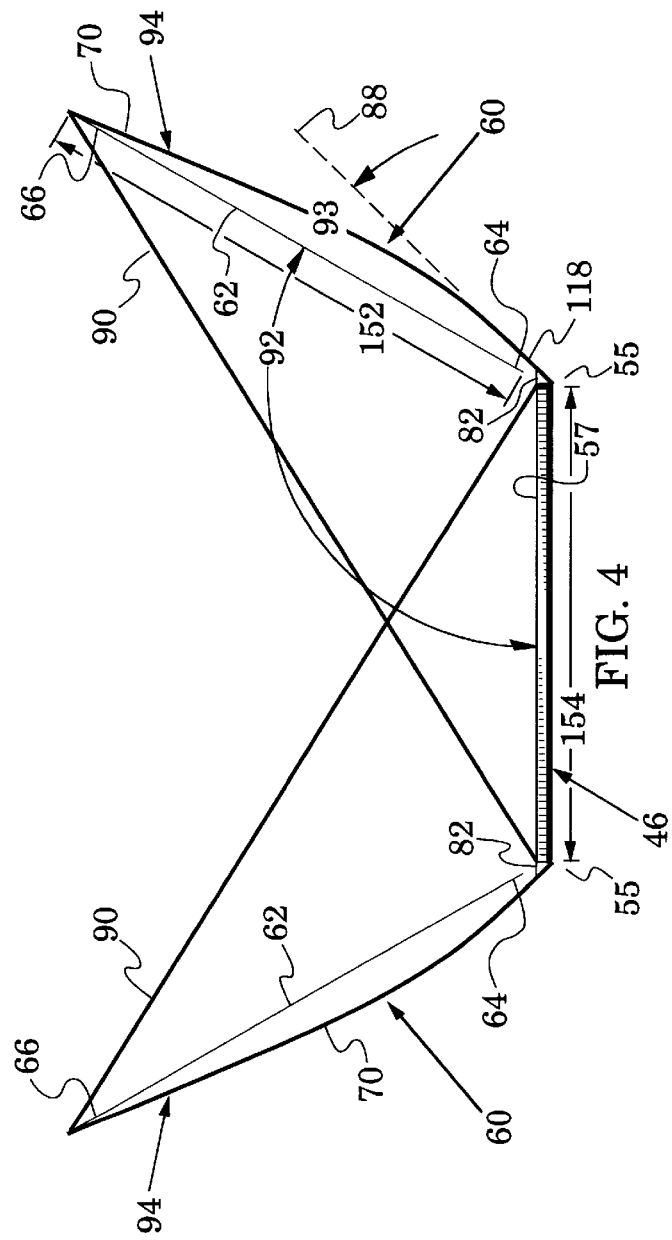
FIG. 4 is an end view of the solar panel and solar reflectors of FIG. 3.
Figure 3:
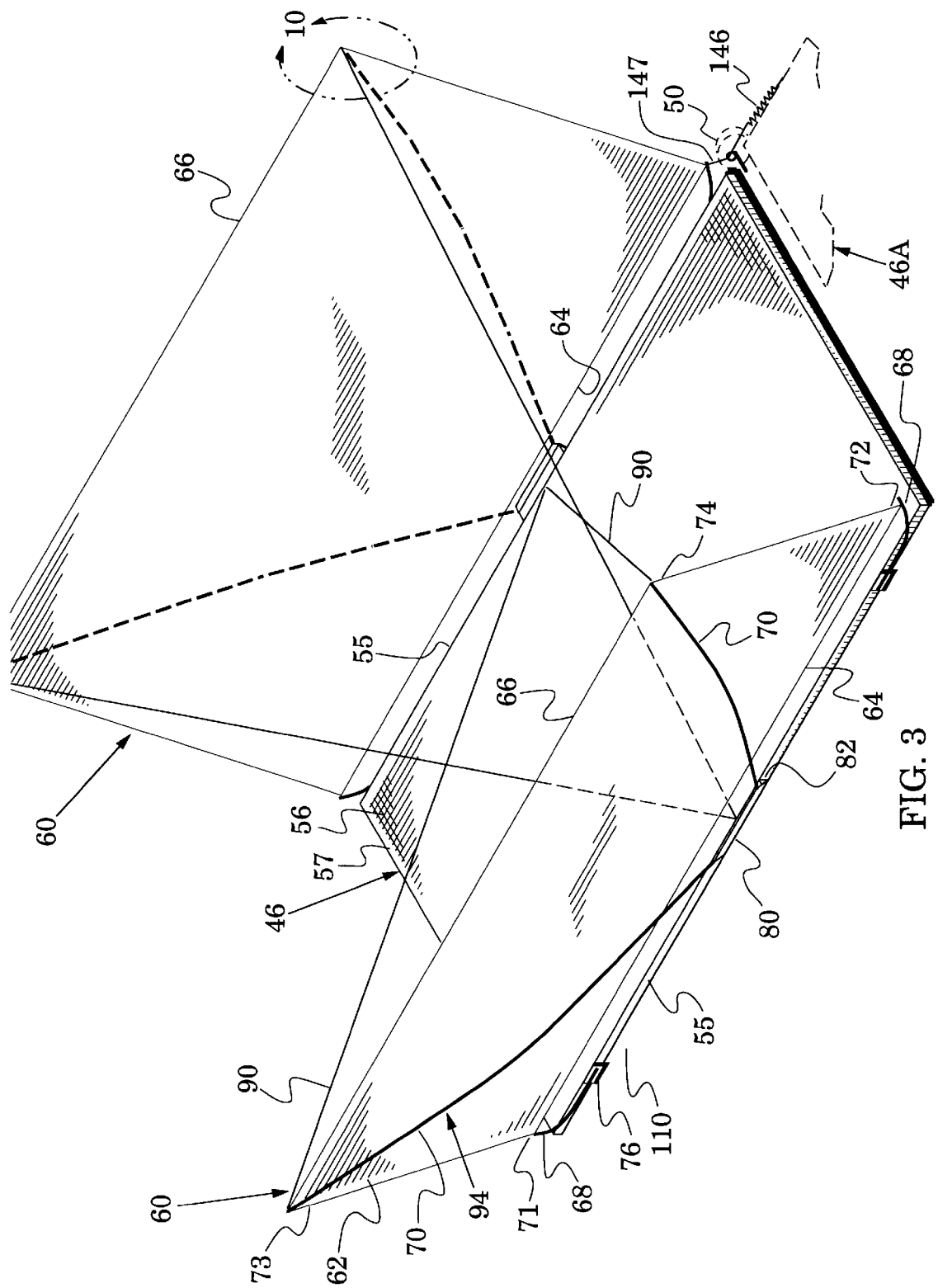
FIG. 3 is an enlarged view of a solar panel in the solar wing of FIG. 2C which illustrates a solar reflector embodiment of the present invention.

The enlarged views of FIGS. 3 and 4 illustrate a single solar panel 46 which extends laterally to a panel edge 55 and carries an array of solar cells 56 on a panel face 57. A pair of solar reflectors 60 is associated with the solar panel 46 and each reflector includes a reflective sheet 62 which has an inner part in the form of an inner margin 64 and an outer part in the form of an outer margin 66. Inner spring members 68 couple the inner margin 64 to the solar panel 46 and outer spring members 70 couple the outer margin 66 to the solar panel (to more clearly show other structures, the inner spring members are omitted from FIG. 4).

The inner spring members 68 are arranged to resiliently urge the inner margin 64 towards the solar panel 46 and the outer spring members 70 are arranged to urge the outer margin 66 away from the solar panel 46. In addition, the inner spring members 68 are coupled to different portions of the inner margin 64 (e.g., the opposed corners 71 and 72 of FIG. 3) and are arranged to urge these margin portions away from each other. Similarly, the outer spring members 70 are coupled to different portions of the outer margin 66 (e.g., opposed corners 73 and 74 of FIG. 3) and are arranged to urge these margin portions away from each other. Thus, the inner and outer spring members cooperatively urge the reflective sheet 62 towards a planar configuration. Accordingly, they achieve static equilibrium and accommodate thermal distortions of the assembly.

In the embodiment of FIGS. 3 and 4, each of the inner spring members 68 is formed of a resilient, elongate member which is rotatably coupled to the edge 55 of the solar panel 46 by a hinge 76 (to more clearly show other structures, the hinge is omitted from FIG. 4). When pulled by the reflective sheet 62 and the outer spring members 70, the inner spring members 68 assume the bent configuration of FIG. 3 in which they urge the opposed corners 71 and 72 away from each other and towards the solar panel 46.

In the embodiment of FIGS. 3 and 4, each of the outer spring members 70 is also formed of a resilient, elongate member which is rotatably coupled to the solar panel's edge 55 by a hinge 80 (to more clearly show other structures, the hinge is omitted from FIG. 4). A stop 82 limits the rotation of the hinge 80. As shown in FIG. 4, an inner portion of each elongate member is thus angularly restrained by the stop 82 and is accordingly directed along a broken direction line 88.

Each solar reflector 60 also includes restraint members in the form of tethers 90 which are connected between the outer margin 66 (e.g., the opposed corners 73 and 74) and an opposite solar panel edge 55. Because of the opposition between the restraining action of the tethers 90, the abutting action of the stop 82 and the restraining action of the reflective sheet 62, each outer spring member 70 is pulled into the bent configuration of FIGS. 3 and 4. In this configuration, the outer spring members 70 urge the opposed corners 73 and 74 away from each other and also away from the solar panel 46.

As the resilient outer spring members 70 try to move to a straight, relaxed state, they urge the reflective sheet 62 to rotate about an axis near and parallel to the solar panel's edge 55 in a direction away from the panel face 57. This rotation is limited by the tethers 90 so that the reflective sheet 62 is restrained in the deployed position of FIGS. 3 and 4. In this deployed position, the reflective sheet 62 defines a deployed angle 92 with the solar panel 46 and a restrained angle 93 with the direction line 88 (angles 92 and 93 are shown only in FIG. 4). The deployed angle 92 is chosen by design to cause the reflective sheet 62 to reflect radiation onto the panel face 57.

Together, the inner spring members 68, the outer spring members 70 and the restraint members 90 form deployment structures 94 which position and hold the reflective sheets 62 in a static force equilibrium at a stable deployed position and orientation so that they concentrate solar radiation onto the solar panels 46.

Operational concentration of solar radiation is illustrated in FIG. 5 which is a view similar to FIG. 4 with like elements represented by like reference numbers. In a central region of FIG. 5, solar radiation 100 falls directly onto the panel face 57 of the solar panel 46. In outer regions of FIG. 5, solar radiation 102 (which without the solar reflectors 60 would pass by the solar panel 46) is reflected from the reflective sheets 62 to be incident onto the panel face 57.

A simple means for making the arrangement less sensitive to small misalignments with the sunline (38 in FIG. 1) is to design the length of the reflective sheet 62 for a given reflector deployed angle 92 to be longer than that shown by the solid lines of FIG. 5. In FIG. 5, for example, broken lines 103 indicate a longer version of one of the reflective sheets 62 and one of the outer spring members 70. Accordingly, solar radiation 104 is shown to be reflected past the opposite solar panel edge 55. This additional reflected radiation facilitates an accommodation of attitude errors between the spacecraft (20 in FIG. 1) and the sunline.

Solar cell conversion efficiency of incident solar radiation into useful electrical energy is a function of the angle of incidence and generally falls off smoothly as the angle of incidence decreases. Accordingly, the radiation 102 that is reflected onto the panel face 57 by the solar reflectors 60 is converted into useful energy at a lower efficiency than the solar radiation 100 which is directly incident. In addition, the solar cell temperatures increase due to the additional reflected solar radiation. This lowers the energy conversion efficiency of the solar cells. Nonetheless, the output power from the solar cells of the solar panel 46 is significantly enhanced by addition of the redirected radiation 102. Accordingly, the solar reflectors 60 facilitate a reduction in the number of solar cells required for a given spacecraft power demand.

FIG. 4 is an end view of the solar reflectors 60 in their deployed position. From this position, the reflective sheets 62 are easily gathered (e.g., rolled or pleated) to a stowed position adjacent to the panel edge 55 as illustrated in FIGS. 6A, 6B, 7A and 7B. FIG. 6A shows an exemplary gathering in which the reflective sheets are rolled for compact stowage beginning at a region midway between the inner and outer margins 64 and 66. Another exemplary gathering is shown in FIG. 6B in which a reflective sheet 62 is pleated for compact stowage. As the reflective sheets 62 are manually gathered for stowage, the outer spring members 70 are manually flexed and rotated about their hinges 80 away from the panel face 57 and towards the solar panel back face 106 as indicated by rotation arrows 107 (the hinges are omitted in FIGS. 6A and 6B to to more clearly show other structures).

In FIG. 7A, an outer spring member 70 has been rotated about its hinge 80 into its stowed position parallel to and adjacent to the panel back surface 106. The outer end 108 of the spring member forms an aperture (e.g., it carries an eyelet 109) and has been bent so that a tip constraint 110 positioned near the panel edge 55 releasably receives the eyelet 109. In an embodiment, the tip constraint 110 is a pin which has an arcuate shape and the free end of the pin curves away from the panel edge 55. The reflective sheet 62 has been gathered into a rolled configuration and positioned adjacent to the panel edge 55. The outer margin 66 is adjacent to the tip constraint 110 and the inner margin 64 is adjacent to the panel face 57. As indicated in FIG. 6A by the broken lines 90A, the restraint members 90 can either be continuously rolled within the reflective sheet 62 or gathered for stowage within the outer layers of the rolled reflective sheet 62.

FIG. 7B shows that the rolled reflective sheet 62 is secured to the panel edge 55 by one or more securement members, each in the form of a flexible strap 112. The strap 112 has a fixed end 113 that is attached to the panel 46 and a free end 114 that is releasably secured to the panel 46 with a conventional releasable securement structure 115 (e.g., releasable snap or pad which is secured between the solar panels when they are in the stowed configuration 48 of FIG. 2A). The strap 112 is shown in its pre-release position by a solid line, and in its post-release position by a broken line.

In an operational storage sequence, the reflective sheets 62 are rolled as the outer spring members 70 are rotated back and their tip apertures are received over their respective tip constraints 110. Each tether 90 is rolled or tucked into the rolled reflective sheet. In a stowed position, the rolled reflective sheet 62 is secured against the panel edge 55 by the securement members 112, and the outer spring members 70 are sandwiched between solar panels in their stowed configuration 48 of FIG. 2A.

In an operational deployment, the outer spring member 70 is released as the solar panels 46 of FIG. 2B move to the deployed configuration 52 of FIG. 2C. The resilience of an outer spring member 70 urges its tip eyelet 109 against the tip constraint 110 of FIG. 7A and, in response, the eyelet 109 slides down the tip constraint 110. The arcuate shape and orientation of the tip constraint directs this urging so that the outer spring member 70 automatically rotates away from the panel back face 106 as indicated by rotation arrow 116 in FIG. 7B. The outer ends 115 of the outer spring members urge the upper margin 66 outward and release the free end 114 of the securement members 112 as shown in FIG. 7B. Note that the free end 114 of a securement member 112 in FIG. 7B is shown in both pre-release and post-release conditions. The reflective sheet is forced to unroll by the upper spring members 70 which continue to rotate and extend as shown in FIG. 6A by the rotation arrows 116.

Once the reflective sheet 62 is urged to release the securement members 112 and leave the stowed configuration as shown in FIGS. 6A, 6B and 7B (in FIG. 7B, a securement member's free end 114 has been pulled loose and is unsecured), the outer spring member's balance forces cooperate with the inner spring members (68 in FIG. 3) to urge the reflective sheet 62 into a planar configuration.

After the reflective sheet 62 has been fully unrolled, the stops 82 limit the angular direction of the inner ends of the outer spring members 70. The restraint members 90 are dimensioned so that the outer spring members are distorted and urge the reflective sheets to rotate away from the panel face 57. This urging is limited such that the reflective sheet 62 is restrained in a deployed position in which it defines an angle (92 in FIG. 4) with the solar panel 46 chosen by design to reflect solar radiation onto the panel face 57.

As the solar panels 46 deploy from their stowed arrangement of FIG. 2A to their deployed configuration of FIG. 2C, their respective solar reflectors rotate from their back faces to the deployed positions of FIG. 2C. Preferably, this rotation is delayed (e.g., by staged passive release devices) to insure that it does not interfere with the accordion movement of the solar panels 46 about their hinges 50. This delay can be accomplished by capturing each outer spring member 70 to its respective panel 46 with a releasable restraint (e.g., a mechanical latch). Once the panels 46 are safely deployed near to the configuration of FIG. 2C, the restraints can be triggered to release by motion of the solar panel hinges 50 and the outer spring members can then automatically move to their deployed position of FIG. 2C.

The movement of the outer spring members 70 between their deployed and stowed positions is further enhanced by providing their inner end with a rotatable attachment as shown in FIG. 8. Extending outward from the hinge 80 (beneath the stop 82) is a hinge leaf 117 which rotatably carries the inner ends 118 of the outer spring members 70 (e.g., by means of a pin 120 for each outer spring member 70). The inner end 118 can thus rotate between a deployed position 118A and a stowed position 118B. In the stowed position 118B, the end 118 is directed upward along the panel mid-region. The stowed position 118B enhances the ability of the outer spring members 70 to lie parallel to the panel back face 106 when in the stowed position of FIGS. 7A and 7B.

Figure 9A:
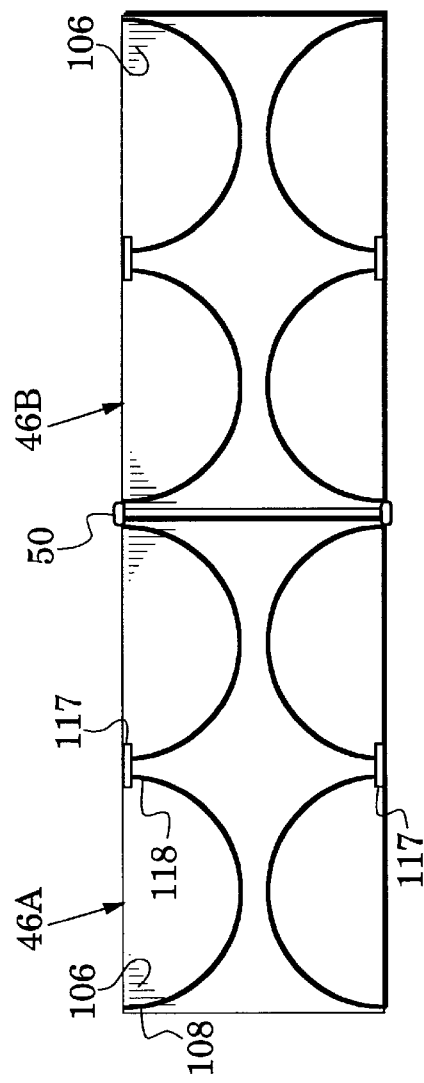
FIG. 9A is a rear view of adjacent solar panels of the solar wing of FIG. 2C which illustrates stowed positions of outer spring members of FIG. 3.

The stowed position 118B also permits the outer spring members 70 to better use the limited space between the back faces of adjacent solar panels 46. For example, FIG. 9A shows the back surfaces 106 of adjacent panels 46A and 46B when they are in the deployed configuration of FIG. 2C. On each of these panels, the inner ends 118 of the outer spring members have been rotated on their respective hinge leafs 117 and stowed into their stowed positions 118B, and the outer ends 108 of the outer spring members 70 have been received into the tip constraints (110 in FIGS. 7A and 7B).

Figure 9B:
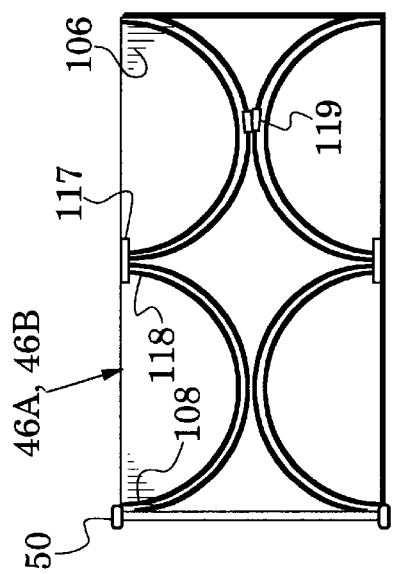
FIG. 9B illustrates the outer spring members of FIG. 9A when the solar panels are folded to the stowed configuration of FIG. 2A.

When the panels 46A and 46B are rotated into their stowed configuration of FIG. 9B (also of FIG. 2A) the outer spring members 70 can be slightly moved so that they nest within each other as indicated in FIG. 9B (for clarity, the panel 46A is assumed to be transparent in this view). As a result, the outer spring members are easily accommodated in the space between the back faces of the adjacent solar panels 46A and 46B. Each outer spring member's diameter can therefore be as great as the interpanel space (e.g., ~1.2 centimeters). To reduce vibrational wear on the outer spring members 70, the members can carry soft, resilient collars 119 (e.g., of silicone rubber) as shown in FIG. 9B.

The outer ends of the outer spring members 70 are preferably rotatably coupled to their respective reflective sheet 62 to facilitate free movement of the sheet. This rotatable coupling can be realized, for example, with a flexible cord 121 that is received through the eyelet 109 at the outer end 108 of the outer spring member 70 and a hole 124 near the outer margin 66 of the reflective sheet 62 as shown in FIG. 10. This outer spring member's tether 90 can be attached to the outer end 108 or can also be received through the eyelet 109. Other exemplary rotatable couplings can be formed by receiving the outer end 108 into a cup that is carried by the sheet corner 74 and formed with a ball and socket structure that is shared between the outer end 108 and the sheet corner 74. Preferably, the sheet corner 74 is strengthened by adding material to the sheet 62 to form a doubler 125 that is indicated by a broken line in FIG. 10. In addition, all edges of the sheet 62 may be strengthened by formation of similar doubler structures.

The outer ends 126 of the inner spring members 68 are also preferably rotatably coupled to their respective reflective sheet 62 to facilitate free movement of the sheet. This rotatable coupling can be realized, as shown in FIG. 11A, with a flexible cord 127 that is received through a hole 128 near the inner margin 64 of the sheet 62 and received through an annular sleeve 129 that slides on the inner spring member 68. Stops 130 on the inner spring member limit the travel of the sleeve 129.

FIG. 11B is similar to FIG. 11A with like elements indicated by like reference numbers. This figure illustrates another rotatable coupling embodiment in which the inner spring member 68 is received through a doubled portion of the inner margin 64. The portion is sewn or bonded to form a channel 132 through which the inner spring member 68 is slidingly received.

FIG. 7A illustrates that the stop 82 has a sloped face 134 which establishes the initial direction 88 of the inner ends 118 of the outer spring members 70 as indicated in FIG. 4. In addition, FIGS. 7A and 8 show rotatable couplings for the inner ends 118 of the outer spring members 70. Another embodiment of these structures is illustrated in FIG. 12 in which the inner end 118 of the outer spring member 70 is rotatably coupled to the solar panel 46 by a cord 136 which attaches to a bracket 138 at the panel edge 55. The upper leg 140 of the bracket 138 extends outward to form a stop 140 which abuts the inner end 118 of the outer spring member 70. This abutment sets the initial direction of the inner end (i.e., the direction 88 of FIG. 4).

FIGS. 13A, 13B and 14 illustrate a resilient elongate tape 150 which is another embodiment of the outer spring members 70 of FIGS. 3 and 4. As shown in detail in FIG. 14, the extended tape 150 has an arcuate cross section 152 which resiliently collapses to a more planar configuration 152A (indicated by broken lines) when the tape is interleavably rolled within an associated reflective sheet 62.

In FIG. 13A, the tape 150 is attached to the panel edges 55 by a stop bracket 154 which holds the inner end of the tape 150 with approximately the same slope as the face 134 of the stop 82 of FIG. 7A. Thus the inner end of the tape 150 is directed along the direction line 88 of FIG. 4. Interleaved with the tape 150, the reflective sheet 62 is preferably rolled from its outer margin towards its inner margin 64 as shown in FIGS. 13A and 13B. In some geometrical realizations of the invention, the restraint members 90 may be too short to roll within the reflective sheet 62. In those cases, the restraint members 90 can be stowed between outer layers of the rolled sheet (similar to the broken line indication 90A of FIG. 6A). Once a reflective sheet 62 and its respective tape 150 elements have been gathered down to the panel edge 55, they are secured there with securement members 112 as shown in FIG. 7B.

In an operational deployment, the tape 150 is released as the solar panels 46 move to the deployed configuration 52 of FIG. 2C. The resilient urging of the rolled tape 150 releases the free end 114 of the securement member 112 of FIG. 7B and drives the unrolling and extension of the reflective sheet 62 to its deployed configuration as indicated in FIGS. 13A and 13B.

Unless otherwise controlled, the resilient, rolled tape 150 may cause the unrolling of the reflective sheet 62 to proceed nonuniformly (i.e., sheet portions may unroll before other portions that are nearer to the inner margin 64). Smooth unrolling of the reflective sheet 62 and tape 150 can be realized by controlling the unrolling so that it begins at the sheet's inner margin (64 in FIG. 3) and proceeds smoothly to the sheet's outer margin (66 in FIG. 3).

FIG. 15A illustrates a sliding constraint member 156 which provides the required control. The constraint member 156 has an arcuate portion 158 at one member end which receives the rolled reflective sheet 62 and tape 150. The other end of the constraint member 156 defines a sleeve 159 which slidingly receives the tape 150. As the rolled reflective sheet 62 and tape 150 unroll as shown in FIGS. 13A and 13B, the tape's local relaxation from the flattened cross-sectional shape 152A to the arcuate cross-sectional shape 152 (FIG. 14) drives the sleeve 159 of the constraint member 156 to move along the tape 150 from the sheet's inner margin 64 to the sheet's outer margin 66. As it slides, the constraint member 156 permits the unrolling to proceed repeatably and uniformly from the inner margin 64 to the outer margin 66.

FIGS. 15B and 16 illustrate another constraint member 160 which provides discretized control of the unrolling reflective sheet 62 and tape 150. In contrast to the sliding constraint member 156, the constraint member 160 is fixed to the tape 150. A free end 162 of the member 160 is pulled about the rolled reflective sheet 62 and tape 150. This free end defines an aperture 164 as shown in the enlarge view of FIG. 16. Another end 165 of the member 160 is fixed to the underside of the tape 150 (e.g., by swaging) and defines a resilient tongue 166 as shown in FIG. 16.

A plurality of the restraint members 160 are distributed along the tape 150 between the sheet's inner margin 64 and the sheet's outer margin 66. As the reflective sheet 62 and tape 150 are rolled in the stowing position from the sheet's outer margin 66, the free end 162 of each restraint member 160 is inserted through a small hole 167 in the sheet 62 so that the tongue 166 is received into the aperture 164 as indicated by the engagement arrow 169. Thus, each of the restraint members 160 constrains a different portion of the reflective sheet 62 and the members 160 sequentially release under the urging of the resilient tape 150 as the reflective sheet unrolls from its rolled, stowed configuration to its planar, deployed configuration.

The solar reflectors of FIGS. 1–12 can be realized with a variety of materials. In an exemplary realization, the reflective sheets 62 are formed of a lightweight, flexible thin-film polymer (e.g., polyimide or polyester in a thickness between 10 and 80 micrometers). To enhance the reflection of solar radiation (102 in FIG. 5), the sheet 62 preferably carries a specularly reflective coating 144 of a metal (e.g., aluminum or silver deposited by vapor deposition) on at least its inner face as indicated locally in FIG. 5.

In some embodiments of the invention, it may be beneficial to add a diffuse reflective characteristic to the otherwise highly specular reflective sheet. This can be done, for example, by embossing or wrinkling or bonding on a loose weave cloth to the reflective sheets's outer face. The added diffuse reflective characteristic would make the radiation reflected onto the solar panel more uniform in distribution.

Large reflective sheets 62 will typically accumulate a significant electrostatic charge which, if discharged suddenly, may cause damage to other spacecraft structures (e.g., the solar cells 56). This charge can be safely dissipated if an electrical path exists to conductive portions of the solar panels 46 (solar panels are typically formed of stiff, semi-conductive facesheets that are carried over a conductive, aluminum honeycomb core). Preferably, therefore, the inner and outer spring members 68 and 70 and the tethers 90 form conductive paths from their associated reflective sheet 62. In an exemplary realization of these elements, therefore, the inner and outer spring members 68 and 70 are formed of resilient, elongate members of conductive graphite and resin composite and the tethers 90 are formed of metal-impregnated, polyamide fibers. When the outer spring members 70 are realized as the tape embodiment 150 of FIGS. 13A–16, the tape is preferably made from a resilient metal such as spring steel or beryllium copper.

Another embodiment of the lower spring members 68 is formed by a conductive helical spring 146 as indicated in FIG. 3. One end of the spring is attached to a cord 147 that is connected to a corner 72 of the reflective sheet. In order to urge the corner 72 towards the solar panel 46 and away from the opposite corner of the inner margin 64, the cord 147 can be led through an eyelet attached to the axle of an interpanel hinge 50. The other end of the helical spring 146 can be terminated on an adjacent solar panel 46A. Alternatively, the spring 146 can be terminated on the same solar panel 46 with its cord 147 routed through an eyelet and attached to an edge bracket which substitutes for the axle of an interpanel hinge 50.

The teachings of the invention can be practiced with various dimensional and geometrical variations of reflector structures. In an exemplary solar reflector of the invention, the deployment angle 92 is substantially 120 degrees and the width 152 of the reflective sheets 62 is 1.1 times the width 154 of the solar panel 46 (the deployment angle and the widths are shown in FIG. 4). It has been calculated that this arrangement would theoretically increase the incident radiation on the panel face 57 by a factor of 2. It has been further calculated that this theoretical concentration factor is typically reduced to the range of 1.7 to 1.9 when pointing errors, reflector flatness, reflector specularity, reflector reflectivity and reflector defects are taken into account. It is estimated that this arrangement of a pair of solar reflectors (60 in FIG. 3) for a solar panel having approximately a 200 centimeter width and a 850 centimeter length will have a weight of approximately 2 kilograms.

When solar panels are folded to the stowed configuration of FIG. 2A, there is often a need for restraint structures (e.g., explosive bolts) in the interpanel region. Because the solar reflectors of the invention facilitate stowage of the reflective sheets (62 in FIG. 3) along a panel edge, they free the interpanel region for other uses and do not limit its use.

Although an embodiment of the invention has been illustrated with pairs of reflective sheets, inner spring members, outer spring members and tethers, the teachings of the invention can also effectively concentrate solar radiation with single members of these structures. In other embodiments of the invention, the coupling of the inner and outer spring members to a solar panel may be facilitated with other structures, e.g., a third member that is rotatably carried by the solar panel.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A solar reflector for concentrating solar radiation upon a panel face of a solar panel which extends to a panel edge, comprising:

at least one flexible, reflective sheet having an inner part and an outer part and gatherable between a substantially planar configuration and a gathered configuration adjacent said panel edge;

at least one securement member arranged to releasably secure said reflective sheet in a stowed position adjacent to said panel edge when said reflective sheet is in said gathered configuration;

at least one inner spring member coupling said inner part to said panel, said inner spring member arranged to urge said inner part towards said panel when said reflective sheet is in said planar configuration;

at least one outer spring member coupling said outer part to said panel, said outer spring member arranged to urge said reflective sheet to release said securement member and extend from said gathered configuration and further arranged to urge said outer part away from said panel so that said inner and outer spring members cooperatively urge said reflective sheet into said planar configuration, said outer spring member also arranged to urge said reflective sheet in a rotation away from said panel face; and at least one restraint member arranged to limit said rotation and restrain said reflective sheet in a deployed position in which it defines an angle with said panel sufficient to cause said reflective sheet to reflect solar radiation onto said panel face.

2. The solar reflector of claim 1, wherein said reflective sheet is formed of a thin-film polymer.

3. The solar reflector of claim 2, wherein said polymer is polyimide.

4. The solar reflector of claim 2, wherein said polymer is polyester.

5. The solar reflector of claim 1, wherein said reflective sheet carries a reflective coating.

6. The solar reflector of claim 5, wherein said reflective sheet has a diffuse reflective surface.

7. The solar reflector of claim 5, wherein said reflective coating comprises aluminum.

8. The solar reflector of claim 1, wherein said inner spring member is a resilient, electrically-conductive, elongate member which forms a conduction path away from said reflective sheet.

9. The solar reflector of claim 8, wherein said elongate member is formed of a graphite fiber and epoxy resin composite.

10. The solar reflector of claim 1, wherein said inner spring member is a metallic helical spring which forms a conduction path away from said reflective sheet.

11. The solar reflector of claim 1, wherein said outer spring member is a resilient, electrically-conductive, elongate member which forms a conduction path away from said reflective sheet.

12. The solar reflector of claim 11, wherein said elongate member is formed of a graphite fiber and epoxy resin composite.

13. The solar reflector of claim 12, wherein said outer spring member terminates at said outer part in a tip and further including at least one tip constraint carried by said panel and configured to releasably receive said tip when said reflective sheet is in said stowed position.

14. The solar reflector of claim 11, wherein said elongate member is rotatably coupled to said panel edge and rotates behind said panel when said reflective sheet is in said stowed position.

15. The solar reflector of claim 11, wherein said elongate member is a resilient tape having an arcuate cross section, said tape interleaved with said reflective sheet when said reflective sheet is in said gathered configuration.

16. The solar reflector of claim 15, further including a plurality of constraint members carried by said tape and distributed between said inner part and said outer part, each of said constraint members configured to releasably constrain a different portion of said reflective sheet when said reflective sheet is in said gathered configuration, said constraint members sequentially releasing as said reflective sheet extends from said gathered configuration to said planar configuration.

17. The solar reflector of claim 15, further including a sliding constraint member slidingly carried by said tape and configured to enclose said reflective sheet when it is in its gathered configuration, said sliding constraint member sliding along said tape from said inner part to said outer part as said reflective sheet extends from said gathered configuration to said planar configuration.

18. The solar reflector of claim 1, wherein said securement member is a flexible strap having a free end which is releasably attached to said panel.

19. The solar reflector of claim 1, wherein said restraint member is an electrically-conductive tether which forms a conduction path away from said reflective sheet.

20. The solar reflector of claim 1, wherein said angle is approximately 120 degrees.

21. The solar reflector of claim 1, wherein said outer spring member includes an inner portion which is coupled to said panel, and further including a stop carried by said panel to abut said inner portion and facilitate the urging of said reflective sheet by said outer spring member that results in said rotation.

22. A solar reflector for concentrating solar radiation upon a panel face of a solar panel which extends to a panel edge, comprising:
   first and second flexible, reflective sheets, each of said reflective sheets having an inner part and an outer part and gatherable between a substantially planar configuration and a gathered configuration adjacent said panel edge; and
   first and second deployment structures respectively coupling said first and second reflective sheets to said panel wherein each of said deployment structures includes:
      a) first and second inner spring members coupling first and second portions of the inner part of a respective one of said reflective sheets to said panel, said first and second inner spring members arranged to urge said first and second inner part portions away from each other and to urge said inner part towards said panel when said respective reflective sheet is in said planar configuration;
      c) at least one securement member arranged to releasably secure said respective reflective sheet in a stowed position adjacent to said panel edge when said respective reflective sheet is in said gathered configuration;
      b) first and second outer spring members coupling first and second portions of the outer part of said respective reflective sheet to said panel, said outer spring members arranged to urge said respective reflective sheet to release said securement member and extend from said gathered configuration and further arranged to urge said first and second outer part portions away from each other and to urge said outer part away from said panel so that said inner and outer spring members cooperatively urge said respective reflective sheet towards a planar configuration, said outer spring members also arranged to urge said respective reflective sheet in a rotation away from said panel face; and
      d) first and second restraint members coupled between said outer part of said respective reflective sheet and said panel to limit said rotation and restrain said respective reflective sheet in a deployed position in which it defines an angle with said respective panel sufficient to cause said respective reflective sheet to reflect solar radiation onto said panel face.

23. The solar reflector of claim 22, wherein each of said reflective sheets includes:
   a thin-film polymer member having inner and outer faces; and
   a reflective metallic coating on at least one face of said polymer member.

24. The solar reflector of claim 22, wherein each of said outer spring members is a resilient, electrically-conductive, elongate member which forms a conduction path away from said respective reflective sheet.

25. The solar reflector of claim 24, wherein said elongate member is a resilient tape having an arcuate cross section, said tape interleaved with said respective reflective sheet when said respective reflective sheet is in said gathered configuration.

26. The solar reflector of claim 25, further including a plurality of constraint members carried by said tape and distributed between said inner part and said outer part, each of said constraint members configured to releasably constrain a different portion of said respective reflective sheet when said respective reflective sheet is in said gathered configuration, said constraint members sequentially releasing as said respective reflective sheet extends from said gathered configuration to said planar configuration.

27. The solar reflector of claim 25, further including a sliding constraint member slidingly carried by said tape and configured to enclose said respective reflective sheet when it is in its gathered configuration, said sliding constraint member sliding along said tape from said inner part to said outer part and releasing said respective reflective sheet as it extends from said gathered configuration to said planar configuration.

28. The solar reflector of claim 22, wherein each of said restraint members is an electrically-conductive tether which forms a conduction path away from said respective reflective sheet.

29. The solar reflector of claim 22, wherein said securement member is a flexible strap having a free end which is releasably attached to said panel.

30. The solar reflector of claim 22, wherein said outer spring member includes an inner portion which is coupled to said panel and further including a stop carried by said panel to abut said inner portion and facilitate the urging of said respective reflective sheet by said outer spring member that results in said rotation.

31. The solar reflector of claim 22, wherein said outer spring member terminates at said outer part in a tip and further including at least one tip constraint carried by said panel and configured to releasably receive said tip when said respective reflective sheet is in said stowed position.

32. The solar reflector of claim 22, wherein each of said outer spring members includes an inner portion which is rotatably coupled to said panel and wherein each of said deployment structures further includes first and second stops carried by said panel to respectively abut the inner portions of said first and second outer spring members and facilitate the urging of said respective reflective sheet by said outer spring members that results in said rotation.

33. A spacecraft system, comprising:
   a spacecraft;
   at least one solar panel carried by said spacecraft to convert solar radiation into electrical power; and
   at least one reflector arranged to concentrate said solar radiation onto said solar panel, said reflector including:
   a) at least one flexible, reflective sheet having an inner part and an outer part and gatherable between a substantially planar configuration and a gathered configuration adjacent said panel edge;
   b) at least one securement member arranged to releasably secure said reflective sheet in a stowed position adjacent to said panel edge when said reflective sheet is in said gathered configuration;
   c) at least one inner spring member coupling said inner part to said panel, said inner spring member arranged to urge said inner part towards said panel when said reflective sheet is in said planar configuration;
   d) at least one outer spring member coupling said outer part to said panel, said outer spring member arranged to urge said reflective sheet to release said securement member and extend from said gathered configuration and further arranged to urge said outer part away from said panel so that said inner and outer spring members cooperatively urge said reflective sheet into said planar configuration, said outer spring member also arranged to urge said reflective sheet in a rotation away from said panel face; and
   e) at least one restraint member arranged to limit said rotation and restrain said reflective sheet in a deployed position in which it defines an angle with said panel sufficient to cause said reflective sheet to reflect solar radiation onto said panel face.

34. The spacecraft system of claim 33, wherein said reflective sheet is formed of a thin-film polymer.

35. The spacecraft system of claim 33, wherein said inner spring member is a resilient, electrically-conductive, elongate member which forms a conduction path away from said reflective sheet.

36. The spacecraft system of claim 33, wherein said outer spring member is a resilient, electrically-conductive, elongate member which forms a conduction path away from said reflective sheet.

37. The spacecraft system of claim 36, wherein said elongate member is rotatably coupled to said panel edge and rotates behind said panel when said reflective sheet is in said stowed position.

38. The spacecraft system of claim 36, wherein said elongate member is a resilient tape having an arcuate cross section, said tape interleaved with said reflective sheet when said reflective sheet is in said gathered configuration.

39. The spacecraft system of claim 33, wherein said securement member is a flexible strap having a free end which is releasably attached to said panel.

40. The spacecraft system of claim 33, wherein said restraint member is an electrically-conductive tether which forms a conduction path away from said reflective sheet.

41. The spacecraft system of claim 33, wherein said outer spring member includes an inner portion which is rotatably coupled to said panel and further including a stop carried by said panel to abut said inner portion and facilitate the urging of said reflective sheet by said outer spring member that results in said rotation.

42. The spacecraft system of claim 33, wherein said outer spring member terminates at said outer part in a tip and further including at least one tip constraint carried by said panel and configured to releasably receive said tip when said reflective sheet is in said stowed position.

* * * * *